US008129722B2

(12) United States Patent

Sung et al.

(10) Patent No.: US 8,129,722 B2
(45) Date of Patent: Mar. 6, 2012

(54) LIGHT EMITTING DISPLAY AND METHOD OF MANUFACTURING THE SAME

(75) Inventors: Dong-Young Sung, Suwon-si (KR); Keun-Soo Lee, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 925 days.

(21) Appl. No.: 12/145,328

(22) Filed: Jun. 24, 2008

(65) Prior Publication Data

US 2009/0033597 A1 Feb. 5, 2009

(30) Foreign Application Priority Data

Jul. 31, 2007 (KR) ........................ 10-2007-0076945

(51) Int. Cl.
*H01L 27/14* (2006.01)

(52) U.S. Cl. ............ 257/72; 345/82; 313/504; 313/498; 313/506; 313/512; 445/25

(58) Field of Classification Search .................. 313/498, 313/504, 506; 445/25; 257/72; 345/82
See application file for complete search history.

(56) References Cited

U.S. PATENT DOCUMENTS

| | | | | |
|---|---|---|---|---|
| 5,953,088 | A * | 9/1999 | Hanazawa et al. | 349/110 |
| 2003/0075718 | A1* | 4/2003 | Jang et al. | 257/72 |
| 2005/0098785 | A1* | 5/2005 | You | 257/72 |
| 2008/0036711 | A1* | 2/2008 | Kwak et al. | 345/82 |

FOREIGN PATENT DOCUMENTS

| | | | |
|---|---|---|---|
| KR | 2000-0045291 | | 7/2000 |
| KR | 2003-0092873 | | 12/2003 |
| KR | 1020050069023 | A | 7/2005 |
| KR | 10-2006-0016247 | A | 2/2006 |
| KR | 10-2006-0021530 | | 3/2006 |

OTHER PUBLICATIONS

Korean Patent Abstracts, Publication No. 1020000045291 A; Date of Publication: Jul. 15, 2000; in the name of Yeong Hun Kim, et al.
Korean Patent Abstracts, Publication No. 1020030092873 A; Date of Publication: Dec. 6, 2003; in the name of Chang Su Seo.
Korean Patent Abstracts, Publication No. 1020060021530 A; Date of Publication: Mar. 8, 2006; in the name of Tae Yup Min.
KIPO Notice of Allowance dated Jan. 28, 2009 for priority Korean application 10-2007-0076945.

* cited by examiner

*Primary Examiner* — Nimeshkumar Patel
*Assistant Examiner* — Mary Ellen Bowman
(74) *Attorney, Agent, or Firm* — Christie, Parker & Hale, LLP

(57) ABSTRACT

A light emitting display and a method of manufacturing the same. The light emitting display includes a substrate, a plurality of first and second signal lines that cross each other on the substrate, a plurality of organic light emitting diodes (OLEDs) coupled between the first signal lines and the second signal lines, a power source supply line for supplying a power source voltage to the OLEDs, and a plurality of inspection signal lines coupled to at least one of the first signal lines or the second signal lines. At least one of the inspection signal lines is discontinuous at a region overlapping the power source supply line and ends of the discontinuous inspection signal line at the region overlapping the power source supply line are coupled to each other through a conductive region under the inspection signal line.

21 Claims, 5 Drawing Sheets

LIGHT EMITTING DISPLAY AND METHOD OF MANUFACTURING THE SAME

CROSS-REFERENCE TO RELATED APPLICATION

This application claims priority to and the benefit of Korean Patent Application No. 10-2007-0076945, filed on Jul. 31, 2007, in the Korean Intellectual Property Office, the entire content of which is incorporated herein by reference.

BACKGROUND

1. Field of the Invention

The present invention relates to a light emitting display and a method of manufacturing the same.

2. Description of the Related Art

An organic light emitting display is a next generation display having a self-emission characteristic and has better characteristics in terms of a viewing angle, contrast, response speed, and consumption power than those of a liquid crystal display (LCD). A backlight is not required so that the organic light emitting display can be made light and thin.

Since the substrate of the organic light emitting display is formed of glass, a large amount of electrostatic discharge (ESD) is generated during manufacturing of the organic light emitting display. When the ESD is received to organic light emitting diodes (OLEDs) or a driving circuit that operates at high speed at a low voltage, erroneous operations may be generated or the OLEDs or the driving circuit may be damaged due to the ESD. When the externally generated ESD is received by the driving circuit through internal signal lines, the operations may be instantaneously stopped or the signal lines that constitute the circuit may be shorted. In particular, when an excessively large voltage is concentrated by the ESD, insulation may be damaged in the parts where the signal lines cross, thereby generating short.

SUMMARY OF THE INVENTION

Accordingly, it is a feature of the present invention to provide a light emitting display capable of preventing signal lines from being damaged by electrostatic discharge (ESD) and a method of manufacturing the same.

It is another feature of the present invention to provide a light emitting display capable of preventing short between signal lines that intersect each other and a method of manufacturing the same.

In order to achieve the foregoing and/or other features of the present invention, according to one aspect of the present invention, there is provided a light emitting display including a substrate, a plurality of first and second signal lines that cross each other on the substrate, a plurality of organic light emitting diodes (OLEDs) coupled between the first signal lines and the second signal lines, a power source supply line for supplying a power source voltage to the OLEDs, and a plurality of inspection signal lines, each of the inspection signal lines coupled to at least one of a corresponding one of the first signal lines or a corresponding one of the second signal lines. At least one of the inspection signal lines is discontinuous at a region overlapping the power source supply line and ends of the discontinuous inspection line at the region overlapping the power source supply line are coupled to each other through a conductive region under the inspection signal line.

According to another aspect of the present invention, there is provided a method of manufacturing a light emitting display. The method includes forming an active region of a TFT and a conductive region of an inspection signal line on a substrate, forming a gate insulation layer on the substrate, the gate insulation layer substantially covering the active region and the conductive region, forming contact holes in the gate insulation layer on the conductive region so that the conductive region is partially exposed at at least two locations, forming a gate electrode, a first signal line, and the inspection signal line coupled to the first signal line and coupled to the conductive region at said at least two locations through the contact holes in the gate insulation layer on the conductive region, forming an insulation layer on the substrate, the insulation layer substantially covering the gate electrode, the first signal line, and the inspection signal line, forming contact holes in the insulation layer on the active region so that the active region is partially exposed at at least two locations, forming source and drain electrodes coupled to respective said at least two locations of the active region through the contact holes, a second signal line that crosses the first signal line, and a power source supply line that crosses the conductive region, and forming an OLED to be coupled to the source electrode or the drain electrode.

According to still another aspect of the present invention, there is provided a substrate on which a plurality of light emitting displays are locate, the light emitting displays separable from each other by scribe lines that cross each other. The substrate includes: a plurality of first common signal lines on the substrate between the light emitting displays, and a plurality of second common signal lines on the substrate between the light emitting displays and crossing the first common signal lines. Each of the light emitting displays includes a plurality of first and second signal lines that cross each other on the substrate, a plurality of organic light emitting diodes (OLEDs) coupled between the first signal lines and the second signal lines, a power source supply line coupled to at least one of the plurality of first common signal lines to supply a power source voltage to the OLEDs, and a plurality of inspection signal lines coupled to the plurality of second common signal lines, each of the plurality of inspection signal lines coupled to at least one of a corresponding one of the first signal lines or a corresponding one of the second signal lines. At least one of the inspection signal lines is discontinuous at a region overlapping the power source supply line, and ends of the discontinuous inspection signal line at the region overlapping the power source supply line are coupled to each other through a conductive region under the inspection signal line.

BRIEF DESCRIPTION OF THE DRAWINGS

These and/or other embodiments and features of the invention will become apparent and more readily appreciated from the following description of certain exemplary embodiments, taken in conjunction with the accompanying drawings of which.

DETAILED DESCRIPTION OF EXEMPLARY EMBODIMENTS

Figure 1:
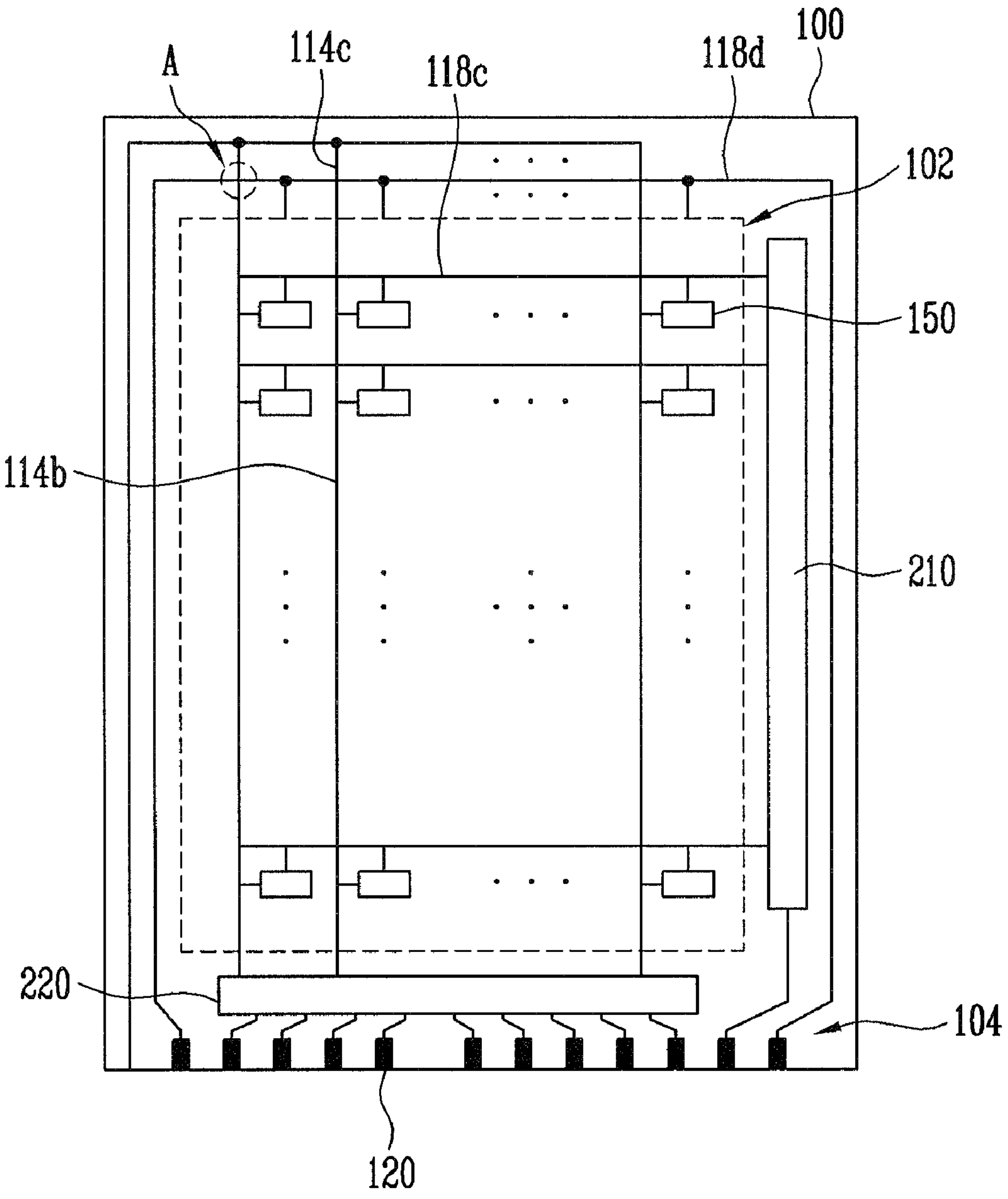
FIG. 1 is a plan view illustrating a light emitting display according to an embodiment of the present invention.

Hereinafter, certain exemplary embodiments according to the present invention will be described with reference to the accompanying drawings. Here, when a first element is described as being coupled to a second element, the first element may be directly coupled to the second element or may alternatively be indirectly coupled to the second element via a third element. Further, some of the elements that are not essential to the complete understanding of the invention are omitted for clarity. In addition, like reference numerals refer to like elements throughout.

FIG. 1 is a plan view illustrating a light emitting display according to an embodiment of the present invention.

The light emitting display according to an embodiment the present invention includes a plurality of scan lines 118*c* and a plurality of data lines 114*b* formed on a substrate 100 to cross each other, a plurality of pixels 150 coupled to the plurality of scan lines 118*c* and the plurality of data lines 114*b*, a power source supply line 118*d* for supplying a power source voltage to the pixels 150, and a plurality of inspection signal lines 114*c* coupled to at least one of the scan lines 118*c* and the data lines 114*b*. Each of the plurality of pixels 150 includes an organic light emitting diode (OLED).

The substrate 100 is divided into a display region 102 and a non-display region 104. The pixels 150 provided between the scan lines 118*c* and the data lines 114*b* are formed on the substrate in the display region 102. In a passive matrix type, the pixels 150 are OLEDs that are coupled between the respective scan lines 118*c* and the data lines 114*b* in a matrix. In an active matrix type, each of the pixels 150 further includes thin film transistors (TFTs) for controlling the operations of the OLED and a capacitor for storing data voltage.

The non-display region 104 is a peripheral region of the display region 102. A scan driver 210 and a data driver 220 for processing signals supplied from the outside through an input pad 120 to supply the signals to the scan lines 118*c* and the data lines 114*b*, the power source supply line 118*d* for supplying a power source voltage to the pixels 150, and inspection signal lines 114*c* for supplying inspection signals to the scan lines 118*c* and/or the data lines 114*b* are formed on the substrate 100 in the non-display region 104.

The scan driver 210 and the data driver 220 can be formed on the substrate 100 in the non-display region 104 in the manufacturing process of the pixels 150 or are manufactured as an additional integrated circuit semiconductor chip to be attached to the substrate 100 by a chip on glass (COG) method or a wire bonding method to be coupled to the scan lines 118*c* and the data lines 114*b*.

The power source supply line 118*d* is formed so that the power source voltage is distributed from the power source bus lines formed in the non-display region 104 to the pixels 150 of the display region 102. The inspection signal lines 114*c* are formed so that the inspection signals are distributed and provided from the signal bus lines formed in the non-display region 104 to the scan lines 118*c* or the data lines 114*b* of the display region 102.

The light emitting display according to an embodiment of the present invention includes the inspection signal lines 114*c* for providing inspection signals to the scan lines 118*c* and the data lines 114*b* of the display region 102. The inspection signal lines 114*c* are provided for effectively inspecting a plurality of display panels in the manufacturing processes in units of a mother substrate. During the manufacturing process, a plurality of display panels are manufactured on a substrate and the inspection signal lines 114*c* are provided to supply signals to the red (R), green (G), or blue (B) OLEDs (in the pixels 150) of the display panels and to inspect the emission state and the brightness. In the drawings, only a few inspection signal lines 114*c* are illustrated. However, the inspection signal lines 114*c* are coupled to the plurality of data lines 114*b* so that the R, G, or B OLEDs of the same column or all the columns is concurrently driven.

In the above structure, since the inspection signal lines 114*c* formed in the non-display region 104 of the substrate 100 are coupled to the scan lines 118*c* or the data lines 114*b* of the display region 102, the inspection signal lines 114*c* can cross the power source supply line 118*d* in the non-display region 104. Therefore, when the thickness of the insulation layer between the power source supply line 118*d* and the inspection signal lines 114*c* is small or an excessive voltage is concentrated due to electrostatic discharge (ESD), shorts may be generated in the parts where the power source supply line 118*d* crosses the inspection signal lines 114*c* due to the damage of insulation.

Therefore, according to an embodiment of the present invention, the inspection signal line 114*c* is partially opened (i.e., is discontinuous) in the part where the inspection signal line 114*c* crosses the power source supply line 118*d* and the both opened ends (i.e., ends formed at the discontinuous portion of the inspection signal line 114*c*) are coupled to each other through a conductive region under the inspection signal line 114*c*.

Figure 2A:
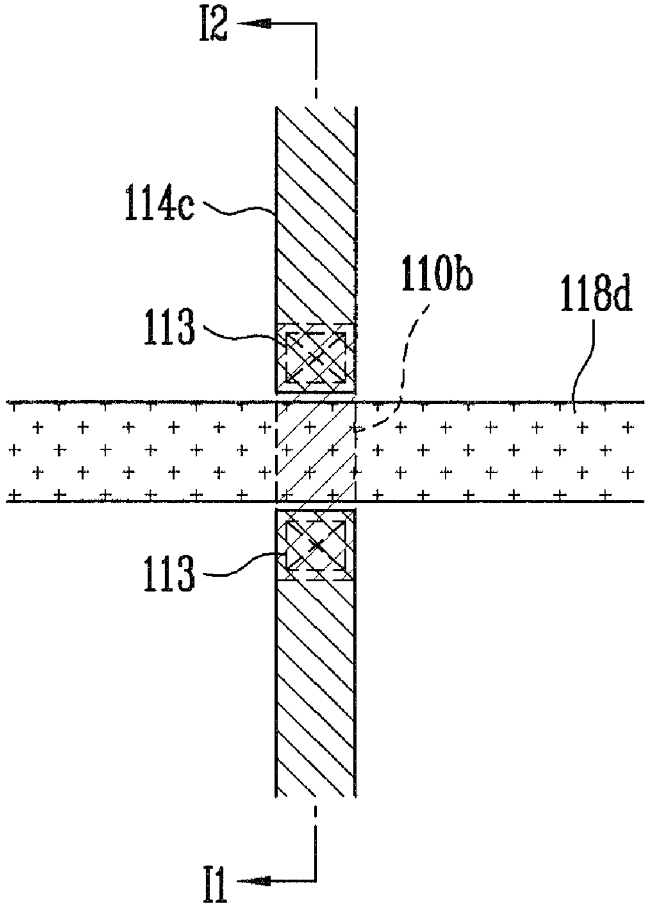
FIG. 2A is an enlarged plan view of the part A illustrated in FIG. 1.
Figure 2B:
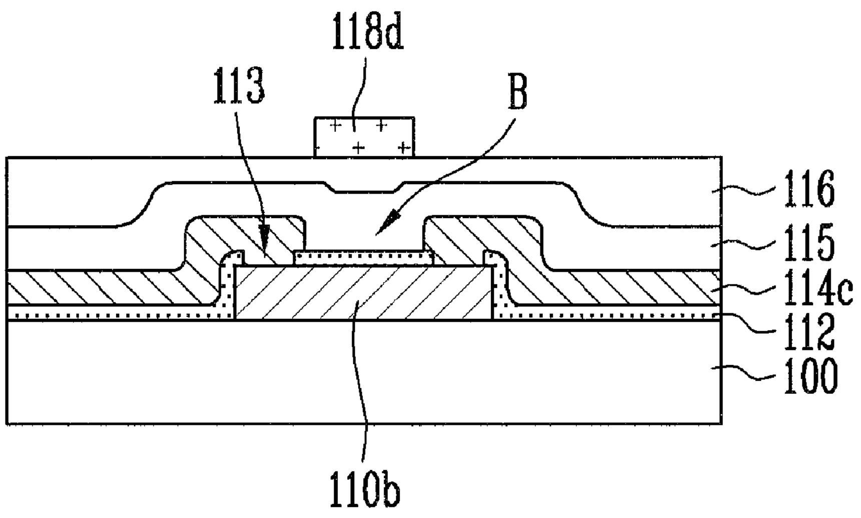
FIGS. 2B is a sectional view taken along the line I1-I2 of FIG. 2A.

FIGS. 2A and 2B are a plan view and a sectional view illustrating an enlargement of the part (e.g., A of FIG. 1) where the power source supply line 118*d* and the inspection signal line 114*c* cross each other. The power source supply line 118*d* to which a power source voltage ELVDD is supplied and the inspection signal line 114*c* to which an inspection data signal VDATA is supplied are illustrated.

Referring to FIGS. 2A and 2B, the inspection signal line 114*c* is formed under the power source supply line 118*d* and is electrically isolated from the power source supply line 118*d* by insulation layers 112, 115, and 116.

The inspection signal lines 114*c* are partially opened (i.e., is discontinuous) at the part (B of FIG. 2B) where the inspection signal line 114*c* crosses the power source supply line 118*d* and the both opened ends are coupled to each other through a conductive region 110*b* under the inspection signal line 114*c*. Here, the both opened ends of the inspection signal line 114*c* are coupled to the conductive region 110*b* through contact holes 113 formed in the insulation layer 112 between the inspection signal line 114*c* and the power source supply line 118*d*.

The distance between the opened ends of the inspection signal line 114*c* is larger than the width of the power source supply line 118*d* and the conductive region 110*b* sufficiently overlap the both ends of the inspection signal line 114*c*.

Then, the method of manufacturing the light emitting display according to an embodiment of the present invention having the above structure will be described with reference to FIGS. 3A to 3D.

FIGS. 3A to 3D are sectional views illustrating a method of manufacturing the light emitting display according to an embodiment of the present invention. The display region in which the pixels 150 are formed and the non-display region 104 in which the power source supply line 118*d* and the inspection signal line 114*c* cross each other will be schematically described.

Figure 3A:
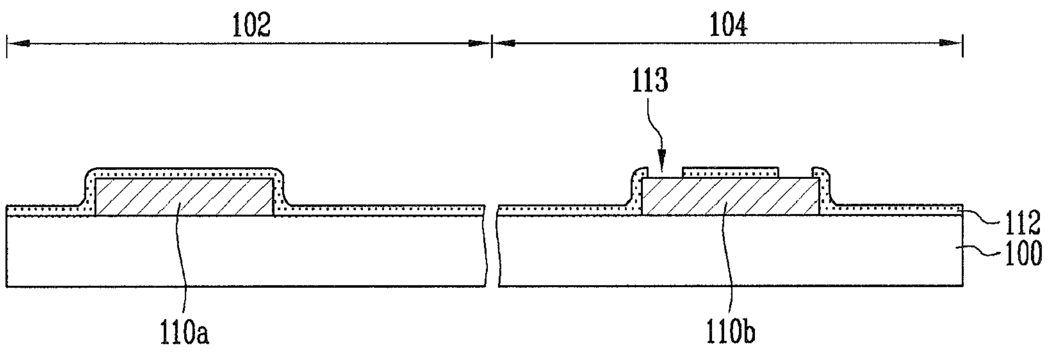
FIGS. 3A to 3D are sectional views illustrating a method of manufacturing the light emitting display according to an embodiment of the present invention.

Referring to FIG. 3A, the substrate 100 divided into the display region 102 and the non-display region 104 is illustrated. An active region 110*a* of the TFT is formed in the display region 102 of the substrate and the conductive region 110*b* of the inspection signal line 114*c* is formed in the non-display region 104. The active region 110*a* and the conductive region 110*b* are formed of a semiconductor layer such as polysilicon. The active region 110*a* is used as the source and drain regions and the channel region of the TFT and the conductive region 110*b* is doped with P type or N type impurity ions to have conductivity. In addition, before forming the active region 110*a* and the conductive region 110*b*, a buffer layer (not shown) can be formed on the substrate 100 using a silicon oxide layer or a silicon nitride layer.

After forming the gate insulation layer 112 on the entire top surface including the active region 110*a* and the conductive region 110*b*, the contact holes 113 are formed so that both sides of the conductive region 110*b* are partially exposed.

Figure 3B:
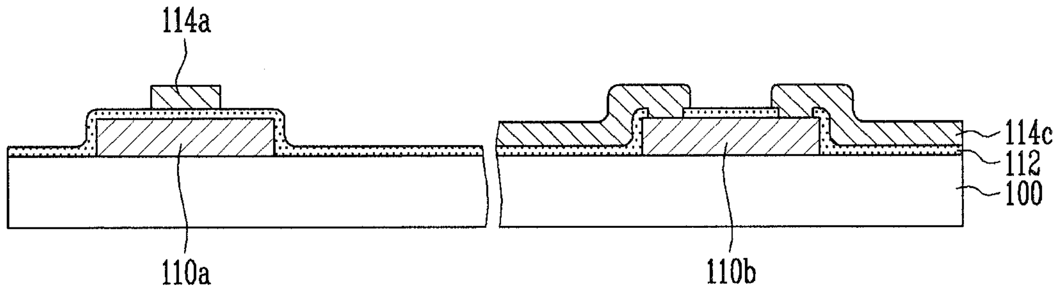

Referring to FIG. 3B, the gate electrode 114a and the data line 114*b* (shown in FIG. 1) coupled to the gate electrode 114*a* are formed on the gate insulation layer 112 on the active region 110*a* and the inspection signal line 114*c* coupled to both sides of the conductive region 110*b* through the contact holes 113 is formed on the gate insulation layer 112 on both sides of the conductive layer 110*b*. The gate electrode 114*a* and the inspection signal line 114*c* can be formed of polysilicon or metal.

Figure 3C:
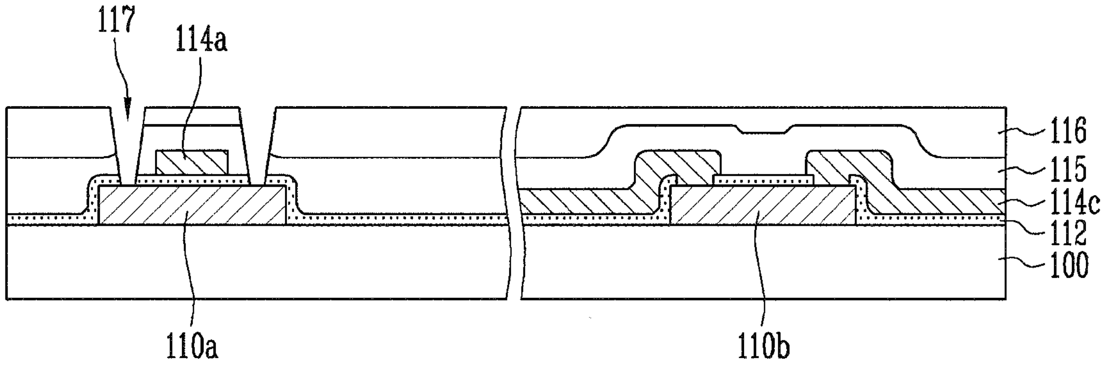

Referring to FIG. 3C, the interlayer insulation layers 115 and 116 are formed on the entire top surface including the gate electrode 114*a* and the inspection signal line 114*c*. Then, the interlayer insulation layers 115 and 116 and the gate insulation layer 112 are patterned to form contact holes 117 so that the source and drain regions of the active region 110*a* are exposed. The interlayer insulation layers 115 and 116 for insulation and planarization have a double layer structure in the described embodiment, however, can have a single layer structure or a multiple layer structure in other embodiments.

Figure 3D:
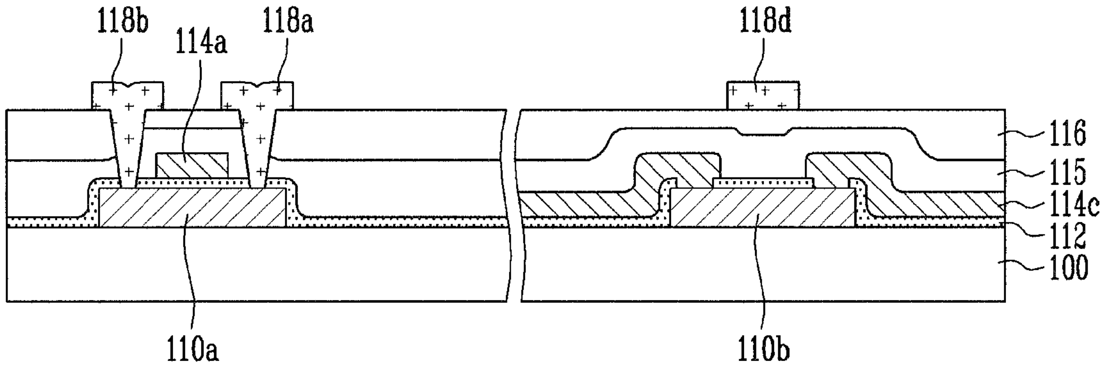

Referring to FIG. 3D, source and drain electrodes 118*a* and 118*b* coupled to the source and drain regions of the active region 110*a* through the contact holes 117 and a scan line 118*c* coupled to the source drain electrode 118*a* and 118*b* are formed in the display region and the power source supply line 118*d* is formed in the non-display region 104. Here, a part of the power source supply line 118*d* crosses the conductive region 110*b* of the inspection signal line 114*c*.

Then, the OLED of the pixel 150 is formed to be coupled to the source or drain electrode 118*a* or 118*b*. The OLED includes an anode electrode, an organic thin layer, and a cathode electrode and the organic thin layer has a structure in which a hole transport layer, an organic light emitting layer, and an electron transport layer are laminated to each other or can further include a hole injection layer and an electron injection layer. Processes of manufacturing the OLED are illustrated in Korean Patent Publication No. 2003-0092873 (published on Dec. 6, 2003), the entire content of which is incorporated by reference.

Figure 4:
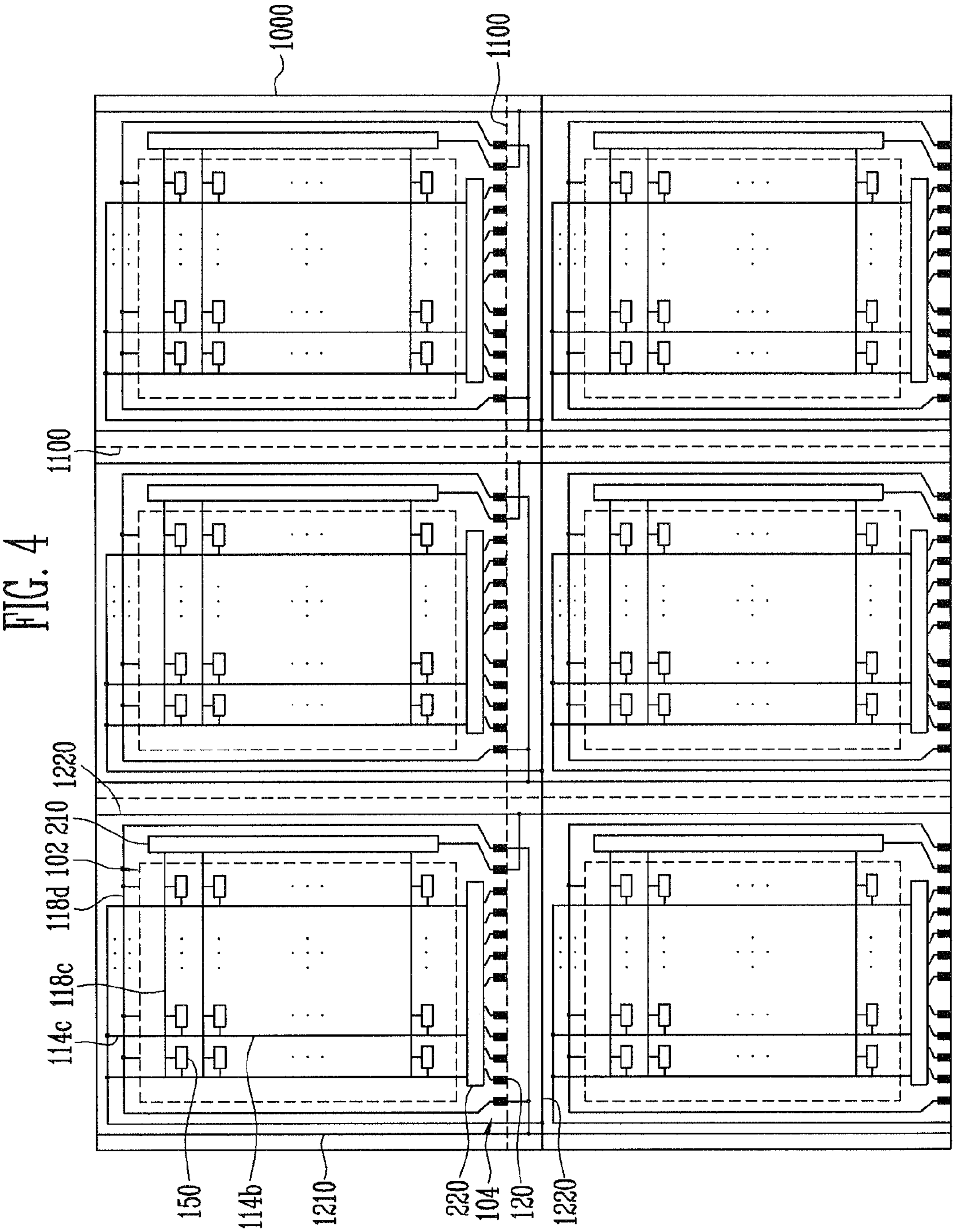
FIG. 4 is a plan view illustrating the light emitting display according to an embodiment of the present invention that is manufactured in units of a mother substrate.

FIG. 4 is a plan view illustrating the light emitting display according to an embodiment of the present invention that is manufactured in units of a mother substrate and illustrates a part of a mother substrate 1000.

The mother substrate 1000 is divided into a plurality of display panels by scribe lines 1100 that cross each other. The light emitting display is formed in each display panel as illustrated in FIG. 1. At this time, the inspection signal lines 114*c* and the power source supply lines 118*d* of the display panels arranged in the same direction are commonly coupled to a common power supply line 1210 and a common signal line 1220 among the plurality of common signal lines arranged to cross each other on the mother substrate 1000. Therefore, a power source voltage and inspection signals are supplied to the common power source supply line 1210 and the common signal line 1220 through a pad (not shown) formed at the edge of the mother substrate 1000 to inspect the OLEDs of the pixels 150 of the display panels. At this time, when the common power source supply line 1210 and the common signal line 1220 are properly arranged, the display panels can be selectively inspected.

After the light emitting displays are inspected, the mother substrate 1000 is cut off along the scribe lines 1100 to separate the plurality of display panels from each other. At this time, the mother substrate 1000 is cut off along the scribe lines 1100 so that the common power source supply line 1210 and the power source supply line 118*d* are electrically separated from each and the common signal line 1220 and the inspection signal lines 114*c* are electrically separated from each other. The sections of the power source supply line 118*d* and the inspection signal lines 114*c* can be exposed at the edge of the substrate 100 of the separated display panel.

In the separated display panel, the inspection signal lines 114*c* are electrically floated. However, in order to have the light emitting display stably operate, the scan lines 118*c* or the data lines 114*b* are coupled to the inspection signal lines 114*c* through switches (not shown) formed of the TFTs so that the scan lines 118*c* or the data lines 114*b* and the inspection signal lines 114*c* are electrically separated from each other.

As described above, there is provided a light emitting display including the inspection signal lines. The inspection signal line is partially opened in the part where the inspection signal line crosses the power source supply line and the both opened ends are coupled to each other through the conductive region formed under the inspection signal line. The distance between the power source supply line and the inspection signal line increases in the part where the power source supply line and the inspection signal line cross each other so that the thickness of the insulation layer increases. Therefore, since insulation is prevented from being damaged even when an excessive voltage is concentrated by the ESD, the electrical characteristic and reliability of the light emitting display are improved.

Although exemplary embodiments of the present invention have been shown and described, it would be appreciated by those skilled in the art that changes might be made in this embodiment without departing from the principles and spirit of the invention, the scope of which is defined in the claims and their equivalents.

What is claimed is:

1. A light emitting display comprising:

a substrate;

a plurality of first and second signal lines that cross each other on the substrate;

a plurality of organic light emitting diodes (OLEDs) coupled between the first signal lines and the second signal lines;

a power source supply line for supplying a power source voltage to the OLEDs; and a plurality of inspection signal lines, each of the inspection signal lines coupled to at least one of a corresponding one of the first signal lines or a corresponding one of the second signal lines, wherein at least one of the inspection signal lines is discontinuous at a region overlapping the power source supply line, and wherein ends of the discontinuous inspection signal line at the region overlapping the power source supply line are coupled to each other through a conductive region under the inspection signal line.

2. The light emitting display as claimed in claim 1, wherein a distance between the ends of the discontinuous inspection signal line at the region overlapping the power source supply line is larger than a width of the power source supply line.

3. The light emitting display as claimed in claim 1, wherein the ends of the discontinuous inspection signal line at the region overlapping the power source supply line are coupled to the conductive region through contact holes formed in an insulation layer between the inspection signal line and the power source supply line.

4. The light emitting display as claimed in claim 3, wherein the insulation layer has a multiple layer structure.

5. The light emitting display as claimed in claim 1, wherein the conductive region comprises a semiconductor layer.

6. The light emitting display as claimed in claim 1, further comprising thin film transistors (TFTs) between corresponding ones of the first and second signal lines and the OLEDs.

7. The light emitting display as claimed in claim 6, wherein the inspection signal lines are in the same layer as gate electrodes of the TFTs, wherein the power source supply line is in the same layer as source and drain electrodes of the TFTs, and wherein the conductive region is in the same layer as an active region of the TFTs.

8. The light emitting display as claimed in claim 7, wherein the conductive region and the active region comprise a semiconductor layer.

9. The light emitting display as claimed in claim 1, wherein sections of the inspection signal lines are exposed at an edge of the substrate.

10. A method of manufacturing a light emitting display, comprising:

forming an active region of a TFT and a conductive region of an inspection signal line on a substrate;

forming a gate insulation layer on the substrate, the gate insulation layer substantially covering the active region and the conductive region;

forming contact holes in the gate insulation layer on the conductive region so that the conductive region is partially exposed at at least two locations;

forming a gate electrode, a first signal line, and the inspection signal line coupled to the first signal line and coupled to the conductive region at said at least two locations through the contact holes in the gate insulation layer on the conductive region;

forming an insulation layer on the substrate, the insulation layer substantially covering the gate electrode, the first signal line, and the inspection signal line;

forming contact holes in the insulation layer on the active region so that the active region is partially exposed at at least two locations;

forming source and drain electrodes coupled to respective said at least two locations of the active region through the contact holes, a second signal line that crosses the first signal line, and a power source supply line that crosses the conductive region; and forming an OLED to be coupled to the source electrode or the drain electrode.

11. The method as claimed in claim 10, wherein the active region and the conductive region are formed of a semiconductor layer.

12. The method as claimed in claim 10, wherein the insulation layer has a multiple layer structure.

13. The method as claimed in claim 10, wherein the inspection signal line is formed near an edge of the substrate.

14. A substrate on which a plurality of light emitting displays are located, the light emitting displays separable from each other by scribe lines that cross each other, the substrate comprising:

a plurality of first common signal lines on the substrate between the light emitting displays; and a plurality of second common signal lines on the substrate between the light emitting displays and crossing the first common signal lines, wherein each of the light emitting displays comprises:

a plurality of first and second signal lines that cross each other on the substrate;

a plurality of organic light emitting diodes (OLEDs) coupled between the first signal lines and the second signal lines;

a power source supply line coupled to at least one of the plurality of first common signal lines to supply a power source voltage to the OLEDs; and a plurality of inspection signal lines coupled to the plurality of second common signal lines, each of the plurality of inspection signal lines coupled to at least one of a corresponding one of the first signal lines or a corresponding one of the second signal lines, wherein at least one of the inspection signal lines is discontinuous at a region overlapping the power source supply line, and wherein ends of the discontinuous inspection signal line at the region overlapping the power source supply line are coupled to each other through a conductive region under the inspection signal line.

15. The substrate as claimed in claim 14, wherein the substrate is cut off along the scribe lines so that the first common signal lines and the power source supply line are separated from each other and the second common signal lines and the inspection signal lines are separated from each other.

16. The substrate as claimed in claim 14, wherein a distance between the ends of the discontinuous inspection signal line at the region overlapping the power source supply line is larger than a width of the power source supply line.

17. The substrate as claimed in claim 14, wherein the ends of the inspection signal line at the region overlapping the power source supply line are coupled to the conductive region through contact holes formed in an insulation layer between the inspection signal line and the power source supply line.

18. The substrate as claimed in claim 14, wherein the conductive region comprises a semiconductor layer.

19. The substrate as claimed in claim 14, further comprising thin film transistors (TFTs) between corresponding ones of the first and second signal lines and the OLEDs.

20. The substrate as claimed in claim 19, wherein the inspection signal lines are in the same layer as gate electrodes of the TFTs, wherein the power source supply line is in the same layer as source and drain electrodes of the TFTs, and wherein the conductive region is in the same layer as an active region of the TFTs.

21. The substrate as claimed in claim 20, wherein the conductive region and the active region comprise a semiconductor layer.

* * * * *